June 3, 1969 F. H. BLITCHINGTON, JR., ET AL 3,448,280

APPARATUS FOR POSITIONING WORKPIECE TO ALINE A CAVITY THEREIN WITH A LIGHT BEAM

Filed Nov. 2, 1966 Sheet 1 of 2

INVENTORS
F. H. BLITCHINGTON, JR.
R. A. HARRIS
BY S. Gundersen
ATTORNEY

United States Patent Office 3,448,280

Patented June 3, 1969

3,448,280

APPARATUS FOR POSITIONING WORKPIECE TO ALINE A CAVITY THEREIN WITH A LIGHT BEAM

Frank H. Blitchington, Jr., Greensboro, and Richard A. Harris, High Point, N.C., assignors to Western Electric Company, Incorporated, New York, N.Y., a corporation of New York Filed Nov. 2, 1966, Ser. No. 591,512

Int. Cl. H01j *5/16;* B22q *17/00*

U.S. Cl. 250—227 4 Claims

This invention relates to methods of and apparatus for positioning a cavity in a workpiece at a preselected location and particularly to such methods and apparatus utilizing light reflected from particular areas on the workpiece to control movement of the workpiece until it is properly positioned.

In many fabricating operations, it is necessary to position a workpiece at a preselected location in order to accurately perform a fabricating operation on the workpiece. For example, a workpiece having a hole therein has to be positioned in accurate alignment with a drill in order to countersink or counterbore the hole. Many devices, including conventional card or tape controlled systems, are available for automatically positioning a hole with respect to a fabricating tool where the location of the hole is known. However, these devices are not satisfactory when the exact location of the hole is unknown such as is the case when the workpiece or a portion thereof consists of a material which is dimensionally unstable; that is, a material which is affected by changes in temperature, humidity, and the like. Polyethylene, a base material in common use in the manufacture of flexible printed circuits is an example of a dimensionally unstable material.

In making printed circuits, a dielectric base material, such as polyethylene, has a layer of electrically conductive material bonded or applied thereto, and a circuit pattern is subsequently formed in the conductive material by well-known methods such as etching. Such circuit patterns include holes or openings which are provided to receive the leads of electrical components which are to be attached to the finished printed circuits. However, before such component leads may be inserted, it is necessary to drill the base material in alignment with the holes or openings formed in the circuit pattern. Since the base material may be dimensionally unstable, an automatic positioning system is usable only to coarsely position a hole in the circuit pattern at a preselected location.

It is an object of this invention to provide a new and improved method of positioning a hole or cavity in a workpiece at a preselected location.

It is a further object of this invention to provide new and improved apparatus for positioning a hole or cavity in a workpiece at a preselected location.

Another object of this invention resides in a method of positioning a cavity in a workpiece at a preselected location by detecting when a beam of light is centered within the cavity.

A further object of this invention is to provide apparatus for directing a beam of light against a workpiece, detecting the positioning of the beam with respect to a cavity in the workpiece, and moving the workpiece until the beam is centered within the cavity.

With these and other objects in view, the present invention contemplates a method of positioning a cavity in a workpiece at a preselected location which includes directing a beam of light against the workpiece with the beam of light having a cross sectional shape corresponding to, but slightly smaller than, the shape of the cavity. Light reflected from the workpiece at less than a predetermined angle is then detected and the workpiece is moved in accordance with the light detected until virtually no light is reflected at less than the predetermined angle. This indicates that the beam of light is centered within the cavity and that the cavity is positioned at the preselected location.

The present invention also contemplates apparatus for positioning a cavity in a workpiece at a preselected location. The apparatus includes facilities for directing a beam of light against the workpiece with the beam of light having a cross sectional shape corresponding to, but slightly smaller than, the shape of the cavity. Photoelectric facilities are provided for detecting light reflected from the workpiece. These photoelectric facilities are positioned such that virtually no light is reflected into them when the beam of light is accurately centered within the cavity. This is accomplished by positioning the photoelectric facilities in an area surrounding the cavity where light reflected from the bottom of the cavity is blocked or eclipsed by the side wall of the cavity. When the light beam is not centered within the cavity, light is reflected off the workpiece into the photoelectric facilities. Other facilities which are controlled by the photoelectric facilities move the workpiece with respect to the light beam in accordance with the light detected by the photoelectric facilities until the cavity in the workpiece is aligned with the beam of light.

Other objects and advantages of the present invention will be apparent from the following detailed description when considered in conjunction with the following detailed drawings.

Figure 1:
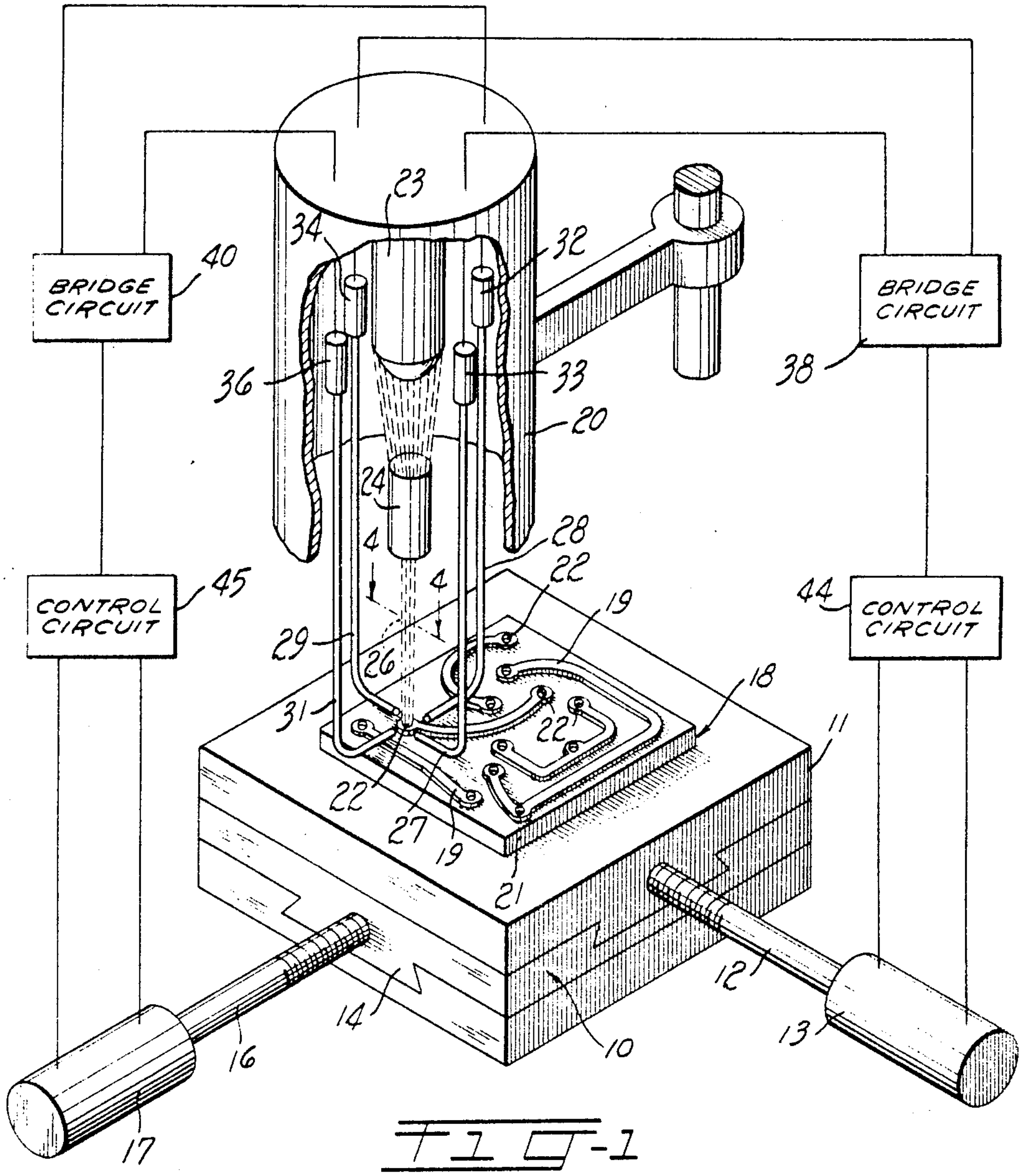
FIG. 1 is a partial perspective, partial schematic view of a photoelectric positioning apparatus embodying the principles of the present invention.

Referring now to FIG. 1, there is shown a photoelectric device for locating holes formed in a printed circuit pattern. The device includes a worktable generally designated as 10, which is movable in the X and Y direction. The worktable 10 includes an upper portion 11, which is movable by a threaded shaft 12 in the X—X direction. The rotation of the threaded shaft 12 is controlled by a servomotor 13. Clutch facilities, which are not shown, are interposed between the motor and the shaft to permit disengagement thereof. A lower portion 14 of the worktable 10 is movable in the Y—Y direction by a threaded shaft 16 which is controlled by a servomotor 17. Clutch facilities are also provided to permit disengagement of shaft 16 from motor 17. A workpiece 18 is mounted to the top of the worktable 10 by clamps or other facilities which are not shown. For the purpose of illustration, the workpiece is a printed circuit board consisting of a conductive circuit pattern 19 and a dielectric base 21. The circuit pattern 19 has a plurality of holes 22 formed therein for receiving the leads of electrical components. The base 21, however, has no corresponding holes. It is to be understood that while this invention is hereinafter described with respect to positioning a hole in a printed circuit pattern at a preselected location, that the invention is nevertheless applicable to positioning any type of workpiece having any shape of cavity therein.

The photoelectric positioning device includes a head 20 positioned above the worktable 10 and having a light source 23 mounted therein. A lens system 24 is positioned between the light source 23 and the printed circuit board 18 for collimating and forming the light rays into a circular beam of light 26 having a diameter slightly smaller than the diameter of the holes 22. It is apparent that the accuracy of the apparatus is dependent upon the size and shape of the light beam being very close to the size and shape of the hole. For example, a light beam of circular cross section having a .049 diameter is used in positioning a hole having a .050 diameter. The head 20 supports four light conducting rods 27, 28, 29, and 31, the upper ends of which are adjacent to photoelectric or light sensitive elements 32, 33, 34, and 36, respectively. The photoelectric elements 33 and 34 control the operation of the servomotor 13 while photoelectric elements 32 and 36 control the operation of servomotor 17.

Figure 2:
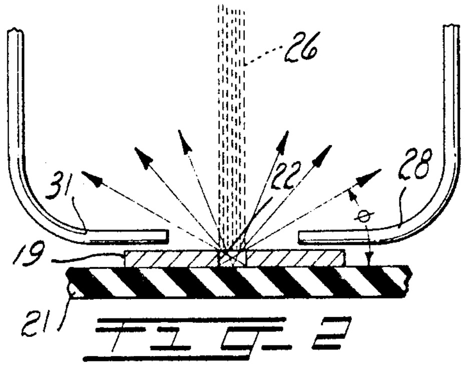
FIG. 2 is a cross sectional, exploded view showing the workpiece and the relative location therewith of the lower ends of the light conducting rods of the apparatus in FIG. 1.

The lower ends of the light conducting rods 27, 28, 29, and 31, are positioned as shown in FIG. 2 so that when the light beam 26 is centered within a hole 22, virtually no light is reflected into the ends of the light conducting rods. This is accomplished by positioning the lower ends of the light conducting rods such that only light reflected at less than a predetermined angle $\theta$ enters the ends of the light conducting rods. The predetermined angle $\theta$ is determined by the depth and diameter of the hole and is the minimum angle at which light can be reflected from the bottom of the hole since light reflected at a lesser angle is blocked or eclipsed by the side wall of the hole. The area surrounding the hole included within the angle $\theta$, constitutes a zone into which no first generation reflected light passes when the light beam 22 is centered within a hole. While some light may be reflected from the bottom of the hole to the side wall of the hole and then reflected into the eclipsed zone, this is second generation reflected light and is not significant enough to effect the operation of the photoelectric elements. The photoelectric elements may, for example, be photodiodes which are set to trigger only when a certain amount of light is detected.

While reference is frequently made to using the apparatus to position a hole having a "bottom," it is evident that the apparatus can also be used to position a hole which goes entirely through a workpiece. In such an application, the upper surface of the worktable on which such a workpiece is mounted is considered to be the "bottom" of the hole for the purpose of determining the predetermined angle $\theta$.

Figure 4:
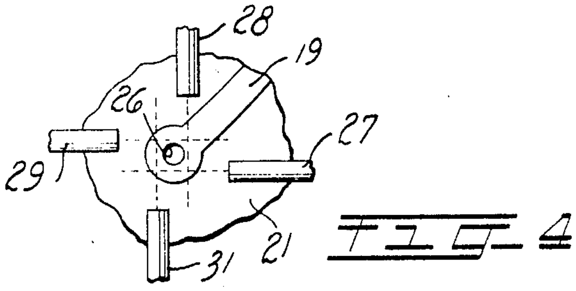
FIG. 4 is a top view showing the location of the lower ends of the light conducting rods with respect to the light beam.

It is to be noted that the ends of the light conducting rods 27, 28, 29, and 31 are canted away from the light beam 26 as shown in FIG. 4, so that only reflected light enters the lower ends thereof and thus, the direct beam 26, itself, has no effect on the operation of the servomotors 13 and 17. Reflected light entering the lower end of a light conducting rod is conducted through the length of the rod and is discharged from the upper end. The photoelectric elements 32, 33, 34, and 36, detect the light discharged from their respective light conducting rods and translate the variations in the light detected into electrical signals which indicate the positioning of a hole 22 with respect to the light beam 26. While it is particularly convenient to use the light conducting rods as described, it is to be noted that they are by no means necessary. If space permits, the photoelectric elements themselves may be mounted adjacent to the workpiece and positioned such that only light reflected at less than the predetermined angle $\theta$ is detected thereby. In this manner, the use of the light conducting rods is obviated.

Figure 5:
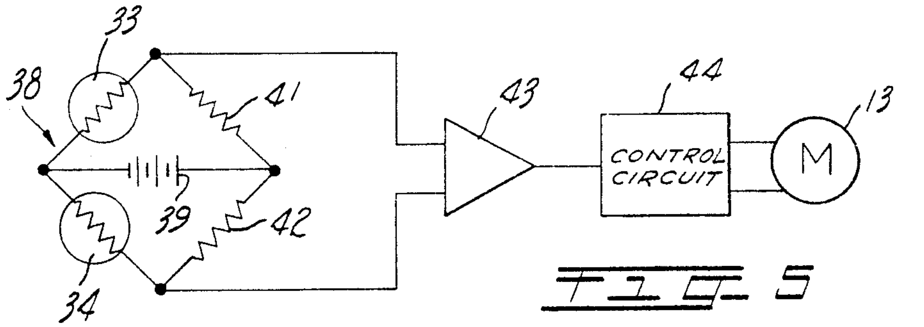
FIG. 5 is an electrical schematic showing the bridge circuit of FIG. 1 in detail.

The photoelectric elements 33 and 34 are connected in a bridge circuit 38 shown in FIG. 5. The bridge circuit includes a reference voltage source, battery 39, connected across two identical parallel arms. Each arm, in addition to containing one of the photoelectric elements 33 and 34, also includes a resistive element 41 and 42, respectively. A differential amplifier 43 is connected between the arms intermediate the respective photoelectric elements and the resistive elements. A control circuit 44 is connected to the differential amplifier 43 and is responsive to electrical signals coming from the amplifier 43 to operate the motor 13 which, in turn, rotates threaded shaft 12 to position the worktable portion 11 in the X—X direction. A similar bridge circuit 40 and control circuit 45 operates the motor 17 which rotates threaded shaft 16 to position the worktable portion 14 in the Y—Y direction.

Figure 6:
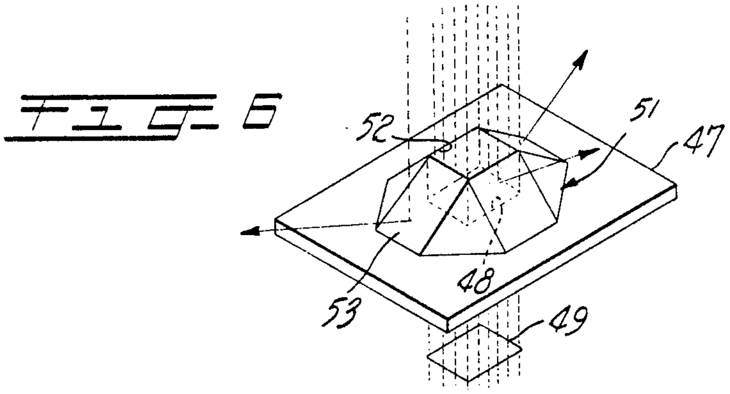
FIG. 6 is a perspective view of a typical mask which can be used with the apparatus shown in FIG. 1 to form a beam of light having a desired cross sectional shape and size.

While the photoelectric positioning apparatus has been described as having a movable worktable, it is evident that the worktable may be stationary while the head 20 is movable. In addition, while the description has referred to locating a round hole in a workpiece, it is to be noted that it can also be used to locate holes or cavities having any shape or configuration. Where such use is desirable, the beam of light must be shaped to correspond to the cross sectional shape of the cavity. Accordingly, a mask such as that shown in FIG. 6 may be used in place of, or in addition to the lens system 24 to facilitate the forming of a beam of light having the desired cross sectional shape and size. Thus, for example, if a workpiece had square holes formed therein, a mask 47, shown in FIG. 6, having a square opening 48, therein, could be interposed between the worktable 10 and the lens system 24 to form a beam of light 49 having a square cross section. A baffle 51, mounted to the upper surface of the mask 47, is provided to prevent light from deflecting off the mask 47 into the path of that portion of the light beam which is to be trasnmitted through the opening 48 in the mask. The baffle 51 consists of a raised lip 52 extending upwardly from the periphery of the opening 48 and sloped deflecting plates 53 connecting the upper edge of the lip 52 with the mask 47. The deflecting plates 53 reflect undesired light away from the opening 48 to prevent interference with the light rays which are permitted to pass through the opening 48 in the mask 47.

Figure 3:
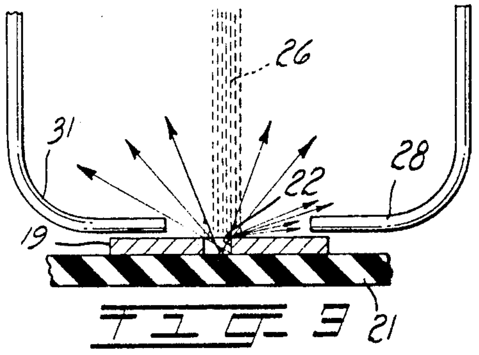
FIG. 3 is a cross sectional, exploded view showing how light is reflected from the workpiece into the lower ends of the light conducting rods when the light beam is not centered within a cavity in the workpiece.

In operation, the worktable 10 is roughly positioned by either an automatic control system, or by an operator who manually positions a hole 22 in alignment with the head 20 so that at least a portion of the light beam 26 falls within a hole 22. Then the operator actuates the clutch facilities to engage shaft 12 and servomotor 13, and shaft 16 and servomotor 17, respectively. If the light beam 26 is not accurately centered within the hole 22, light is reflected from the upper surface of the workpiece, as shown in FIG. 3, and impinges in varying intensities on the lower ends of the light conducting rods according to the position of the hole with respect to the light beam. The light is discharged from the light conducting rods into their respective photoelectric elements in the bridge circuits to produce an electrical signal of a certain magnitude and polarity which operates servomotors 13 and 17 to move the worktable toward its proper position. The workpiece continues to move until the light beam 26 is centered within the hole 22 whereupon no first generation reflected light is directed into the ends of the light conducting rods 27, 28, 29, and 31, as shown in FIG. 2, and the motors stop. The motors 13 and 17 are then disengaged from the shafts 12 and 16 and a fabricating tool, such as a drill, is moved into the place of the light beam 26 and the fabricating operation performed.

It is to be understood that the above-described embodiment is merely illustrative of the application of the principles of this invention and that numerous other arrangements and modifications may be made within the spirit and scope of the invention.

What is claimed is:

1. An apparatus for positioning a cavity in a workpiece at a preselected location comprising:

means for projecting a beam of light having a cross sectional shape substantially corresponding to but slightly smaller than the shape of said cavity against said workpiece;

photoelectric means for detecting light reflected from said workpiece at an angle less than a predetermined angle and for producing electrical signals varying with the amount of light detected; and means responsive to said electrical signals for moving said workpiece perpendicularly with respect to said beam of light to center said light beam within said cavity whereupon no light is reflected at less than the predetermined angle indicating that the cavity is positioned at the preselected location.

2. Apparatus for positioning a cavity in a workpiece at a preselected location comprising:

a table mounted for planar movement having a workpiece secured thereto;

means for directing a beam of light perpendicularly against said workpiece, said beam of light having a cross sectional shape substantially corresponding to but slightly smaller than the shape of said cavity;

photoelectric means for detecting light reflected from the workpiece at an angle less than a predetermined angle, said predetermined angle being the minimum angle at which light can be reflected from the bottom of the cavity; and means responsive to said photoelectric means detecting light for moving said table in accordance with the amount of light detected until said light beam is centered within said cavity indicating that the cavity is positioned at the preselected location.

3. A photoelectric device for positioning a cavity in a workpiece as a preselected location, comprising:

means for projecting a collimated beam of light against the workpiece, said beam of light having a cross sectional shape substantially corresponding to but slightly smaller than the shape of said cavity;

four light conducting rods, each rod having an end thereof equidistantly positioned about said light beam and located within the zone where light reflected from the bottom of the cavity is eclipsed by the side wall of the cavity;

photoelectric means positioned at the opposite ends of said light conducting rods for detecting light discharged from said rods; and means responsive to said photoelectric means detecting light discharged from one or more of said light conducting rods for moving said workpiece until no light is reflected from the bottom of the cavity into said zone whereupon the workpiece is held stationary at the preselected location.

4. A photoelectric device for positioning a cavity in a workpiece at a preselected location comprising:

a table mounted for movement in the X and Y directions and having a workpiece secured thereto;

a light source positioned above said workpiece;

means positioned between said light source and said workpiece for collimating and forming the light rays from said source into a light beam having a cross sectional shape substantially corresponding to but slightly smaller than the shape of said cavity;

a plurality of light conducting rods spaced about said light beam, each having an end thereof directed to receive light reflected from said workpiece at an angle less than a predetermined angle, said predetermined angle being the minimum angle at which light can be reflected from the bottom of the cavity;

a photoelectric element mounted at the opposite end of each of said light conducting rods; and means responsive to said photoelectric elements detecting light discharged from its respective light conducting rod for moving said table to center said light beam within said cavity.

References Cited

UNITED STATES PATENTS

| | | | |
|---|---|---|---|
| 2,703,505 | 3/1955 | Senn | 88—14 |
| 3,029,348 | 4/1962 | Heinz | 250—221 |
| 3,316,800 | 5/1967 | Kibler | 88—14 |
| 3,370,293 | 2/1968 | Green | 250—203 X |
| 3,395,287 | 7/1968 | Rajac | 250—230 X |

V. LAFRANCHI, *Primary Examiner.*

JAMES W. LAWRENCE, *Assistant Examiner.*

U.S. Cl. X.R.

29—406, 407; 88—14; 219—124; 250—203, 219, 224